(12) United States Patent
Yu et al.

(10) Patent No.: US 11,889,617 B1
(45) Date of Patent: Jan. 30, 2024

(54) TECHNIQUES FOR HIGH-SPEED SIGNAL LAYER TRANSITION

(71) Applicant: Baidu USA LLC, Sunnyvale, CA (US)

(72) Inventors: Zhenwei Yu, Sunnyvale, CA (US); Yun Ji, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/901,208

(22) Filed: Sep. 1, 2022

(51) Int. Cl.
*H05K 1/11* (2006.01)
*H05K 3/42* (2006.01)
*H05K 1/02* (2006.01)

(52) U.S. Cl.
CPC ........... *H05K 1/0237* (2013.01); *H05K 1/116* (2013.01); *H05K 3/42* (2013.01); *H05K 2201/09627* (2013.01); *H05K 2201/09672* (2013.01)

(58) Field of Classification Search
CPC ..... H05K 1/113–116; H05K 3/42–429; H05K 1/0237
See application file for complete search history.

(56) References Cited

U.S. PATENT DOCUMENTS

| | | | |
|---|---|---|---|
| 2007/0063352 A1* | 3/2007 | Archer | H01L 24/13 257/E23.021 |
| 2015/0181724 A1* | 6/2015 | Iketani | H05K 3/429 29/852 |
| 2019/0075653 A1* | 3/2019 | Beesley | H05K 3/429 |

* cited by examiner

*Primary Examiner* — Jeremy C Norris
(74) *Attorney, Agent, or Firm* — WOMBLE BOND DICKINSON (US) LLP

(57) ABSTRACT

A printed circuit board includes first and second surfaces, first and second layers, and first and second vias. The first via extends from a first layer to the second surface and includes a first portion that is on a conductive path between the first layer and the second layer and a second portion that is not on the conductive path. A length of the first portion of the first via is greater than that of the second portion of the first via. The second via extends from the second surface to the second layer. The second via includes a first portion that is on the conductive path between the first layer and the second layer and a second portion that is not on the conductive path. A length of the first portion of the second via is greater than that of the second portion of the second via.

20 Claims, 14 Drawing Sheets

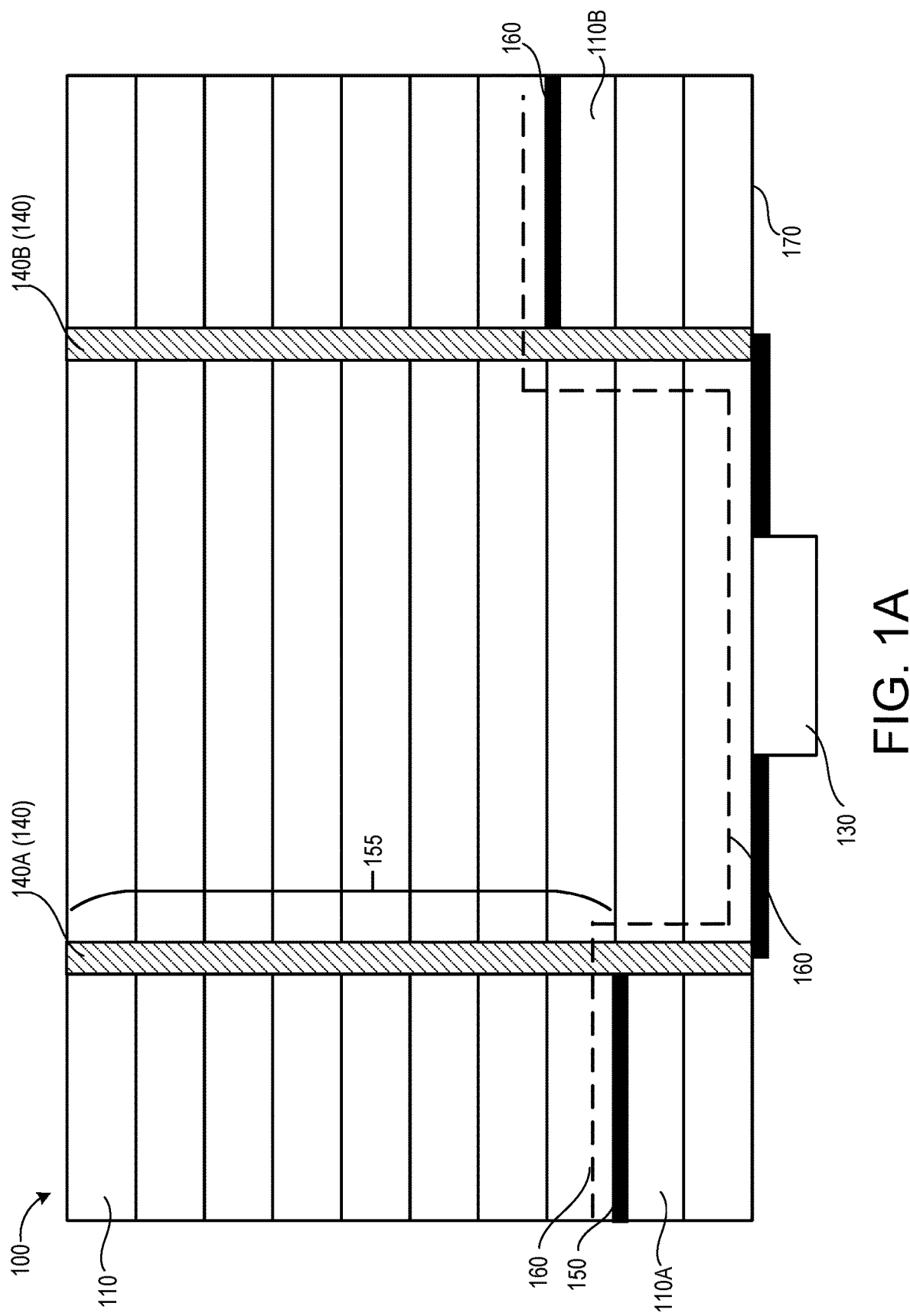

TECHNIQUES FOR HIGH-SPEED SIGNAL LAYER TRANSITION

TECHNICAL FIELD

This disclosure relates generally to multi-layer circuit configurations, and, in particular, to layer transitions in a printed circuit board (PCB).

BACKGROUND

High-speed data communication is a prominent factor in computer systems. There has been a need of a higher-bandwidth, faster-speed interconnect technology for computer systems and peripherals. In addition, the increasing speed of telecommunications and other network infrastructures have increased the demand for devices capable of both high-speed communication and high-speed processing. As communication and processing speeds of the electronic devices increase, a lower margin of error exists for variances in the signaling of these devices before the signaling is adversely affected.

Processing and/or communication on electronic devices are typically transported on electrical paths within the electronic device. These paths may take several forms. One such form is a printed circuit board (PCB). A PCB may be a laminated structure of alternating conductive and insulating layers. PCBs may provide electrical connections between the components of the electronic device which may be mounted to a surface of the PCB and/or formed within the layers of the PCB. In some cases, the PCB may utilize vias, which are conductive through holes that allow interconnections between layers.

BRIEF DESCRIPTION OF THE DRAWINGS

The present invention is illustrated by way of example and not limitation in the figures of the accompanying drawings in which like references indicate similar elements.

FIG. 1A is a schematic block diagram of a printed circuit board (PCB).

DETAILED DESCRIPTION

Figure 1B:
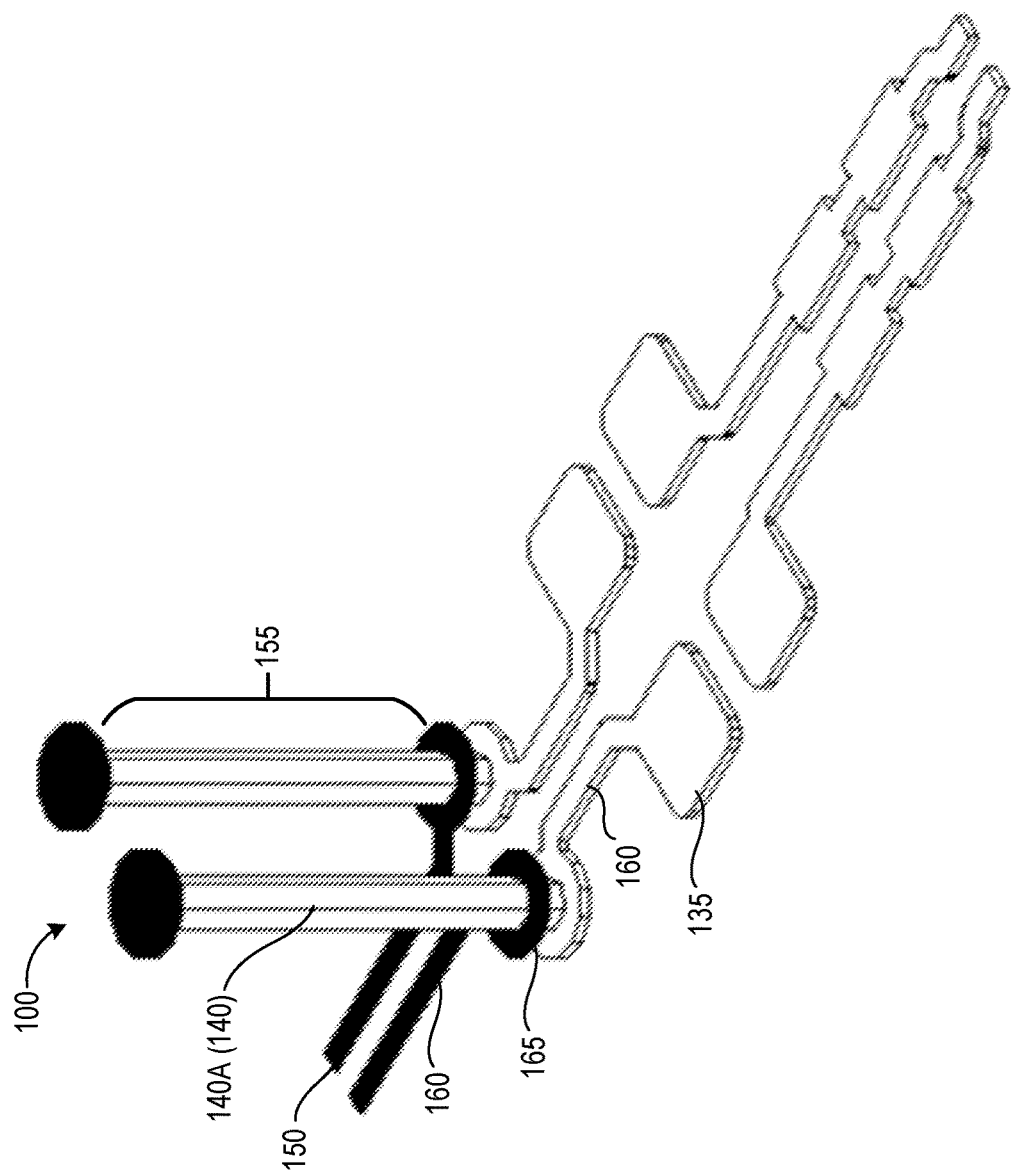
FIG. 1B is a perspective view of the PCB of FIG. 1A.

Various embodiments and aspects will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment. The appearances of the phrase "in one embodiment" and/or "in some embodiments" in various places in the specification do not necessarily all refer to the same embodiment. The processes and/or methods depicted in the figures that follow may be performed by processing logic that comprises hardware (e.g. circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

To improve the throughput of electronic devices, speeds of operation are often increasing. For example, PCBs may be used to implement devices that communicate utilizing Peripheral Component Interconnect (PCI) protocols, such as PCI Express (PCI-E). PCI-E can support serial bit rates per lane of 5 Gb/s (Generation 2.0), 8 Gb/s (Generation 3.0), 16 Gb/s (Generation 4.0), and 32 Gb/s (Generation 5.0), as examples. As other examples, networking speeds can exceed 10 Gb/s in many networking infrastructures. Other examples of high-speed transmissions will be understood by those of ordinary skill in the art. Devices configured for high-speed operation may have a lower margin for error due to the frequency of the transmissions being utilized within the devices. At higher speeds, variations in amplitude or frequency of a propagating signal may have negative impacts.

In some embodiments, the signals may be propagated using and/or within a PCB. The PCB may include a flat sheet of insulating material and a layer of conductive material, such as copper foil, that is on the insulating material. Processing, such as etching, may separate the copper into conductive paths, pads for connections to semiconductor elements, vias to pass connections between layers of copper, and features such as solid conductive areas for electromagnetic shielding or other purposes. The conductive paths may function as wires fixed in place, and may be insulated from each other, such as by the insulating layer.

The PCB may include multiple layers, each layer having different conductive paths and/or electrical structures. The various layers of the PCB may be connected to one another using vias. In some embodiments, circuit elements and/or electronic components such as semiconductor devices (e.g., capacitors, resistors, inductors, integrated circuits (ICs), and the like) may be attached to a surface of the PCB. Internal conductive paths of the PCB may extend wiring in the layers of the PCB between other layers of the PCB and/or a surface of the PCB. In some embodiments, the transitions between the layers of the PCB and/or to a surface of the PCB may be accomplished using vias between the layers.

However, transitions between the layers of the PCB for a given conductive signal path can introduce electrical anomalies. The anomalies can affect the quality of the signal and degrade the operation of the resulting devices. As will be discussed in further detail herein, the various transitions between the layers of the PCB and/or to a surface of the PCB may introduce what is known as a stub into the conductive path. As the length of the stub increases and/or the frequency of operations increases, this stub may degrade the quality of the electrical signal being transferred on the conductive path.

The embodiments of the present disclosure address these and other problems by proposing devices and methods that utilize transition techniques in the wiring of the conductive paths of the PCB that reduce a size of and/or eliminate these stubs from the conductive path(s) of the PCB. By removing and/or reducing the stubs, the interference caused by the stub may be likewise removed and/or reduced. This may result in an improved signal and, as a result, an improved PCB and electronic device.

FIG. 1A is a schematic block diagram of a printed circuit board (PCB) 100 illustrating the challenges of stubs within the PCB 100. FIG. 1B is a perspective view of the PCB 100 of FIG. 1A. FIGS. 1A and 1B may illustrate challenges with the PCB 100 as recognized by the inventors. FIGS. 1A and 1B, as well as the other figures, may use like reference numerals to identify like elements. Thus, the same or similar numbers may be described with reference to other drawings even if they are neither mentioned nor described in the corresponding drawing. Also, elements that are not denoted by reference numbers may be described with reference to other drawings. A letter after a reference numeral, such as "110A," indicates that the text refers specifically to the element having that particular reference numeral. A reference numeral in the text without a following letter, such as "110," refers to any or all of the elements in the figures bearing that reference numeral.

Referring to FIG. 1A, a PCB 100 may include multiple layers 110. In some embodiments, the layer 110 may include an insulating material covered and/or implanted with a conductive material, such as copper. The conductive material of the layers 110 of the PCB 100 may be etched or otherwise processed to form a conductive path 160. The conductive path 160 may extend along and/or in between the layers 110.

In some embodiments, the conductive path 160 may extend between the layers 110 utilizing a via 140. In FIG. 1A, a first via 140A and a second via 140B are illustrated, though other configurations of via 140 will be understood by those of ordinary skill in the art. The vias 140 may be formed by creating holes in the layers 110 of the PCB 100. In some embodiments, the holes may be formed by drilling. Though FIG. 1A illustrates the vias 140 penetrating the entire PCB 100, the embodiments of the present disclosure are not limited to such a configuration. The holes in the PCB 100 may be made conductive, such as by electroplating with copper, so as to form a conductive via 140. In some embodiments, the holes may be made conductive prior to the layers 110 of the PCB 100 being laminated together.

The conductive vias 140 may be utilized to connect different layers 110 of the PCB 100 to one another and/or to a surface 170 of the PCB. For example, a conductive path 160 may be routed on conductive trace and/or wire 150 of a first layer 110A to a first via 140A and then routed on and/or through the first via 140A to the surface 170 of the PCB 100. In some embodiments, an electronic component 130 (e.g., a capacitor, a resistor, an IC, or the like), also referred to herein as a circuit component, may be mounted to the surface 170 of the PCB 100 and electrically connected to the conductive path 160. As also illustrated in FIG. 1A, the conductive path 160 may connect to a second via 140B that extends through the layers 110 of the PCB 100 to a second layer 110B.

FIG. 1B illustrates a portion of the conductive path 160 of FIG. 1A, with the layers 110 of FIG. 1A removed. Referring to FIG. 1B, it can be seen that the vias 140 are implemented as structures that extend substantially perpendicular to the portions of the conductive paths 160 formed by the conductive traces/wires 150. The conductive path 160 may extend to the via 140 and be electrically connected to the via 140 (e.g., the via 140 can be formed through a conductive pad 165 that is coupled to the conductive path 160).

The conductive path 160 may extend onto the surface of the PCB 100 by a connection to the via 140 at or near the surface of the PCB 100. The conductive path 160 may then extend on the surface of the PCB 100 to a mounting pad 135. The mounting pad 135 may be provided to allow for a mounting surface for the electronic component 130 illustrated in FIG. 1A. The electronic component 130 may be mounted to the mounting pad 135 after the conductive path 160 is formed. Though not expressly illustrated in FIG. 1B, the conductive path 160 may further extend from the mounting pad 135 for the electronic component 130 to connect to other portions of the PCB 100 (e.g., another via 140).

In this way, the conductive path 160 can interconnect different layers 110 and/or elements of the PCB 100 in a compact fashion. By designing/etching segments of the conductive path(s) 160 of the PCB 100 on the various layers (e.g., to form the conductive traces 150), placing vias 140 within the PCB 100, and routing the segments of the conductive path(s) 160 to the various vias 140, complex circuits can be designed to implement portions of an electronic device.

However, as illustrated in FIGS. 1A and 1B, the structure of the via 140 utilized in the PCB 100 may create stubs 155. For example, the configuration of the conductive path 160 and the vias 140 may result in a segment 155 of the via 140 that is not directly a part of the conductive path 160 but is nonetheless electrically connected to the conductive path 160. For example, the segment 155 of the first via 140A of FIGS. 1A and 1B is electrically connected to the conductive path 160 at the connection of the conductive path 160 to the first via 140A (e.g., at the conductive pad 165) but is not directly in the conductive path 160 that extends from the segment of the conductive path 160 on the first layer 110 to the segment of the first via 140 between the first layer 110A and the surface 170 of the PCB 100, and further to the portion of the conductive path 160 on the surface 170 of the PCB 100 and connected to the electronic component 130. This segment 155, also referred to herein as a stub 155, terminates at the end of the first via 140A.

Figure 2:
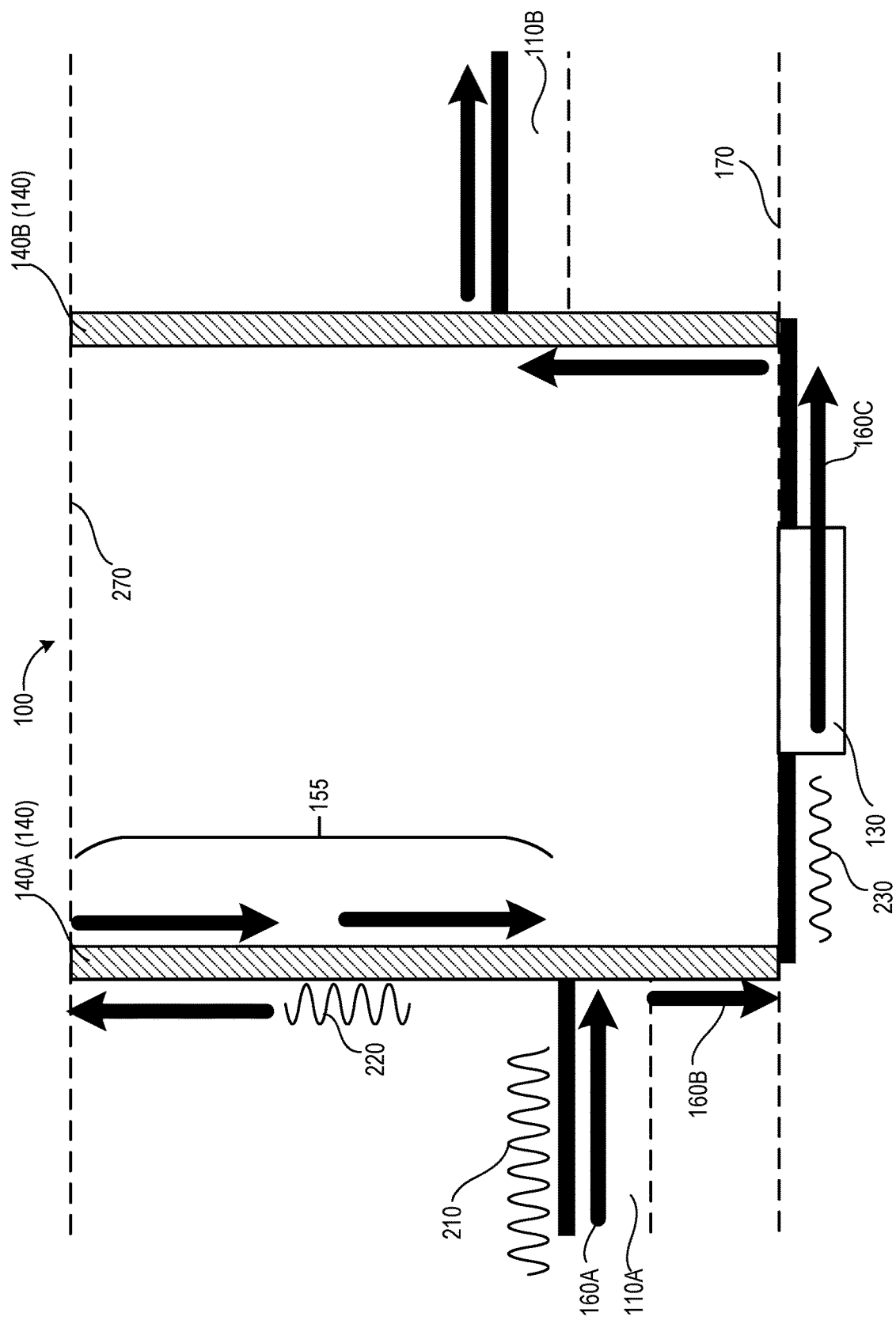
FIG. 2 is a schematic block diagram illustrating the electrical operation of the PCB of FIGS. 1A and 1B.

FIG. 2 is a schematic block diagram illustrating the electrical operation of the PCB 100 of FIGS. 1A and 1B. A description of elements of FIG. 2 that have been described previously will be omitted for brevity.

In FIG. 2, the conductive path 160 between the first layer 110A, the electronic component 130, and the second layer 110B is illustrated, which extends from a first segment 160A (e.g., on the first layer 110 of FIG. 1A) to a second segment 160B (e.g., a portion of the first via 140A and to a third segment 160C (e.g., on a first surface 170 of the PCB 100) that is connected to an electronic component 130 mounted on the first surface 170. A signal 210 may be transmitted on the conductive path 160.

As illustrated in FIG. 2, the first via 140A may include a stub 155 that extends between the first layer 110A and a second surface 270 of the PCB 100 that is opposite the first surface 170 (e.g., the first surface 170 on which the conductive path 160 extends). The first via 140A may terminate at the second surface 270 of the PCB 100. Because of the termination of the first via 140 and the electrical connection of the stub 155 to the conductive path 160, the potential exists for a signal reflection that may be susceptible to resonance.

For example, a portion 220 of the signal 210 that is transmitted on the conductive path 160 may be diverted to the stub 155. The portion 220 of the signal 210 may reflect from the termination of the first via 140A and propagate back to the connection point between the conductive path 160 and the first via 140A. Depending on the length of the stub 155, the portion 220 of the signal 210 that reflects from the termination of the first via 140A may interfere with the signal 210 of the conductive path 160.

The stub 155 may include a length of a conductive transmission line that is connected at one end only. The stub 155 may introduce an anomaly into the signal 210 of the conductive path 160 due to standing waves of the diverted signal portion 220 along its length. The reactive properties of the stub 155 may be determined, in part, by a physical length of the stub 155 in relation to the wavelength of the signal 210.

For a given frequency of the signal 210, if a time delay for the diverted portion 220 of the signal 210 to travel through the stub 155 equals a ¼-wavelength, then when the diverted portion 220 reflects at the termination of the first via 140A and reaches the junction again, it may be delayed by ½ a cycle. The ½-cycle delay may cause the diverted portion 220 of the signal 210 to cancel some portion of the signal 210, resulting in a degraded signal 230.

The relationship between a maximum frequency fmax of the signal 210 and an acceptable upper limit for the length of the stub 155 may be given by:

$$ls \le \frac{c}{4\sqrt{Ereff} \cdot R \cdot fmax} \qquad \text{(Equation 1)}$$

where ls is the length of the stub 155, c is the speed of light, Ereff is the effective dielectric constant of the PCB material, fmax is the maximum frequency component of the signal 210 to be transmitted on the conductive path 160, and R is a constant denoting an operating margin for the PCB operation.

For operations in the PCI-e range, a length of a stub 155 should generally be smaller than half a millimeter (0.5 mm) to avoid signal degradation. However, as a size of the PCB 100 increases, this can be difficult to achieve. For example, as a number of layers 110 of the PCB 100 and/or a thickness of individual layers 110 of the PCB 100 increase, a size of the via 140 needed to extend from a top surface to a bottom surface of the PCB 100 may increase similarly. For example, a thickness of a PCB 100 may be 2 mm or greater. Thus, a via 140 having a stub 155 that extends for more than a quarter of the thickness of the PCB 100 may cause signal degradation.

Figure 3A:
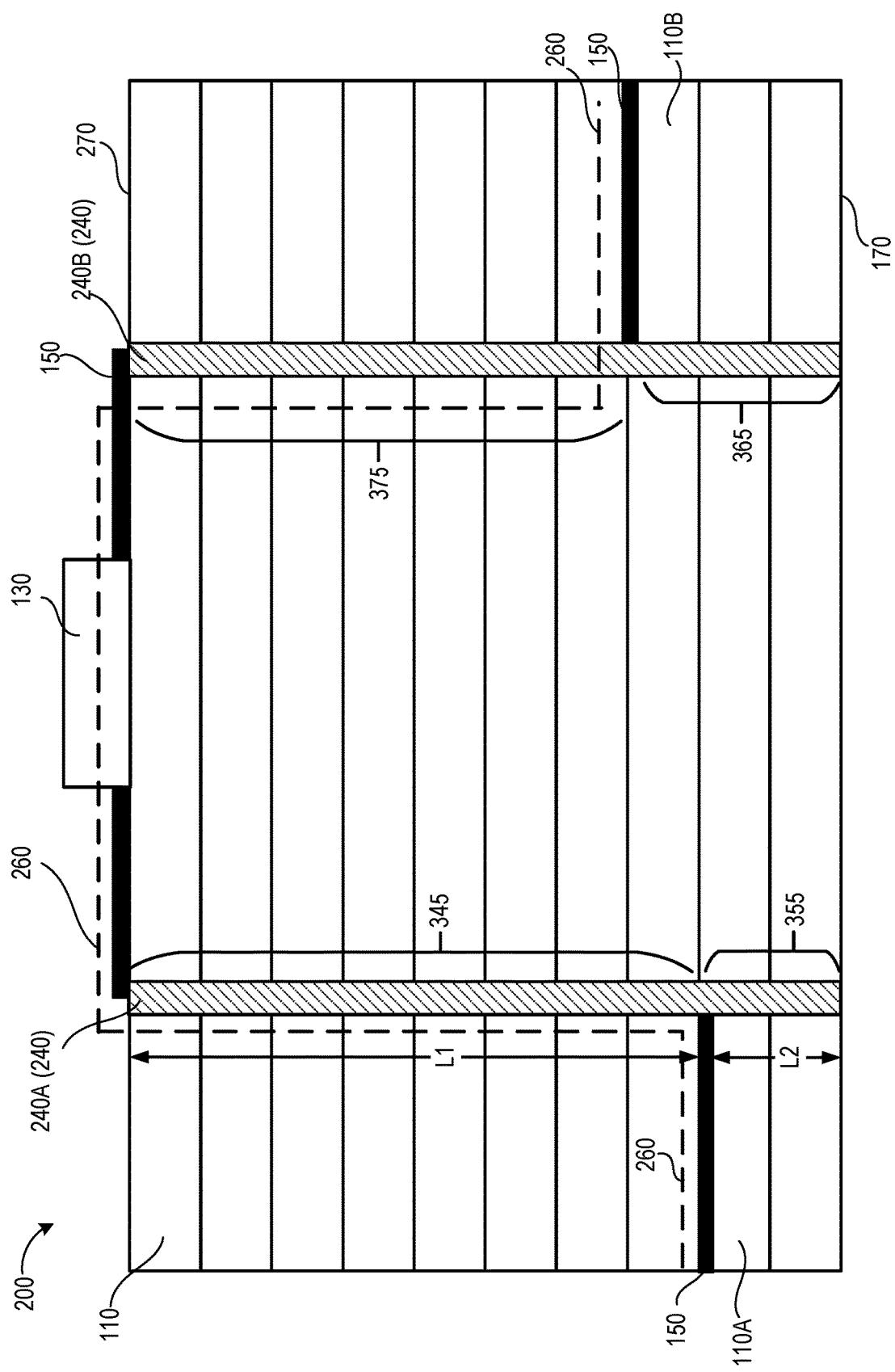
FIG. 3A is a schematic cross-section illustrating a wiring routing and via location for a PCB, in accordance with some embodiments of the present disclosure.
Figure 3B:
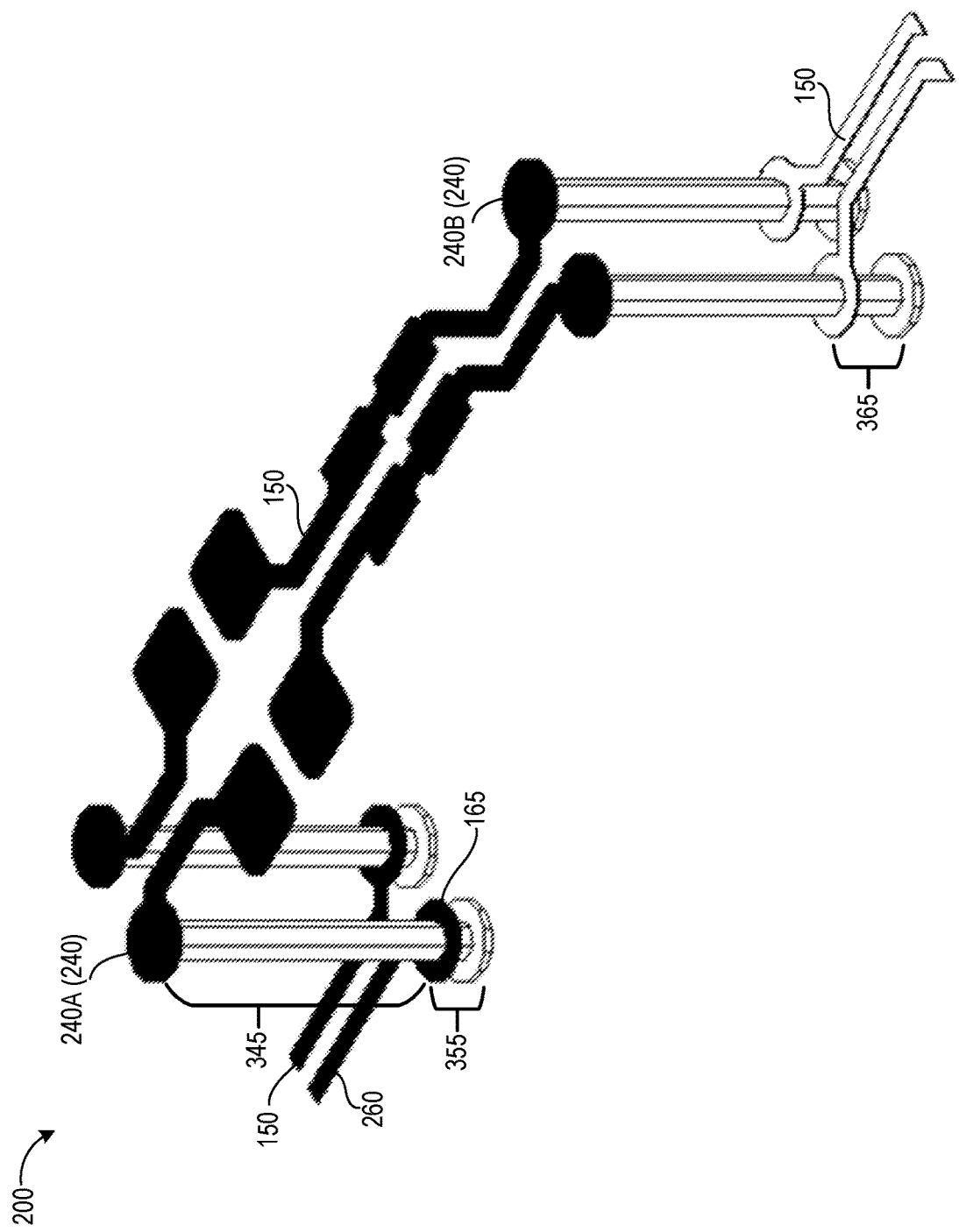
FIG. 3B is a perspective view of the PCB of FIG. 3A.

FIG. 3A is a schematic cross-section illustrating a wiring routing and via location for a PCB 200, in accordance with some embodiments of the present disclosure. FIG. 3B is a perspective view of the PCB 200 of FIG. 3A. A description of elements of FIG. 3A that have been previously described with respect to previous figures will be omitted for brevity.

Referring to FIG. 3A, the components of the PCB 200 may be similar to those illustrated and described with respect to the PCB 100 of FIG. 1A. For example, the PCB 200 may include a plurality of stacked layers 110. Conductive portions of the layers 110 may be arranged so as to form a conductive path 260 (which may also be referred to as an electrical path or a signal path). For example, copper arranged on the layers 110 may be etched to form conductive traces 150 that form portions/segments of the conductive path 260.

The conductive path 260 may extend on a first layer 110A (e.g., on conductive trace/wire 150), traverse across a portion of a first via 240A to a surface 270 of the PCB 200. The conductive path 260 may traverse on the surface 270 to an electronic component 130 and couple to a second via 240B. The conductive path 260 may continue on the second via 240B to a second layer 110B of the PCB 200 (e.g., to a conductive trace/wire 150 on and/or in the second layer 110B). In some embodiments, the first layer 110A may be different (e.g., on a different level within the stack of layers 110 of the PCB 200) from the second layer 110A.

FIG. 3B illustrates a portion of the conductive path 260 of FIG. 3A, with the layers 110 of FIG. 3A removed. Referring to FIG. 3B, it can be seen that the conductive path 260 may extend to the vias 240 and be electrically connected to the vias 240 (e.g., the vias 240 can be formed through a conductive pad 165 that is coupled to the conductive path 260).

In contrast to the PCB 100 of FIG. 1A, the portion of the conductive path 260 within the first via 240A may extend to a different surface 270 of the PCB 200. For example, in FIG. 1A, the conductive path 160 extends to the first surface 170 of the PCB 100. In FIGS. 3A and 3B, the conductive path 260 extends to the second surface 270 of the PCB 200 that is on an opposite side of the PCB 200 from the first surface 170. Stated another way, in the PCB 200, a portion of the first via 240A that is used as part of the conductive path 260 extends to an opposing surface in comparison to the PCB 100 of FIG. 1A. The implementation of FIGS. 3A and 3B may result in an improved operation of the PCB 200.

Moving the electronic component 130 from the first surface 170 to the second surface 270 results in a different portion of the first via 240A and second via 240B being used for the conductive path 260. For example, the first via 140A may have a first portion 345 that is part of the conductive path 260 (e.g., on the conductive path 260 between the first layer 110A and the second layer 110B) and a second portion 355 that is not on the conductive path 260 between the first layer 110A and the second layer, but is electrically coupled to the first portion 345. In some embodiments, a first length L1 (e.g., a longitudinal dimension) of the first portion 345 of the first via 240A may be greater than a second length L2 of the second portion 355 of the first via 240A. Stated, another way, the first length L1 of the first portion 345 of the first via 240A between the first layer 110A and the surface 270 to which the conductive path 260 extends is greater than a distance between the first layer 110A and the opposing surface 170. In some embodiments, a length L2 of the second portion 355 is smaller than 0.5 mm.

The use of the first via 240A as part of the conductive path 260 results in a stub formed from the second portion 355 of the first via 240A. As can be seen from FIGS. 3A and 3B in comparison to FIG. 1A, however, the stub 355 (e.g., the second portion 355 of the first via 240A) of the PCB 200 is smaller in size as compared to the stub 155 of PCB 100. The reduced length L2 of the stub 355 may make it less susceptible to resonance and signal interference at the operating frequencies of the PCB 200. For example, a length of the stub 355 is more likely to meet the characteristics of Equation 1.

Though the discussion with respect to FIGS. 3A and 3B focused on the first via 240A, it will be recognized that a size of a stub 365 of the second via 240B has been reduced as well in comparison to the PCB 100 of FIG. 1A. For example, the second via 240B may include a first portion 375 that is on the conductive path 260 between the first layer 110A and the second layer 110B and a second portion 365 that is not on the conductive path 260 between the first layer 110A and the second layer 110B. A length of the first portion 375 of the second via 240B may be greater than a length of the second portion 365 of the second via 240B. Thus, by moving the electronic component 130 from a first surface 170 (as in FIG. 1A) to a second surface 270 (as in FIGS. 3A and 3B) may result in an improvement with respect to signal degradation at operating frequencies of the PCB 200. Though the conductive path 260 is increased in length as compared to the length of the conductive path 160 of FIG. 1A, any signal delay due to the increased signal path may, in some embodiments, be outweighed by the signal quality improvements for high-speed signals.

FIGS. 3A and 3B illustrate that the operation of a PCB 200 may be improved by reducing a dimension of a stub 355, 365 within vias 240 that are part of a conductive path 260 of the PCB 200. In FIGS. 3A and 3B, the improvement in the routing of the conductive path 260 was accomplished in a way that altered a surface on which the electronic component 130 was mounted. However, in some embodiments, altering a surface on which an electronic component 130 is mounted may be difficult. For example, the electronic component 130 may have additional electrical connections that may be easier to access on a particular surface. As another example, in some embodiments a particular surface of the PCB 200 may be preferable for component mounting (e.g., due to the machines used in forming the PCB 200), other components that may be mounted to that surface, and the like. Some embodiments of the present disclosure may be capable of improving the transmission quality of a PCB without altering a surface upon which an electronic component 130 is mounted.

Figure 4A:
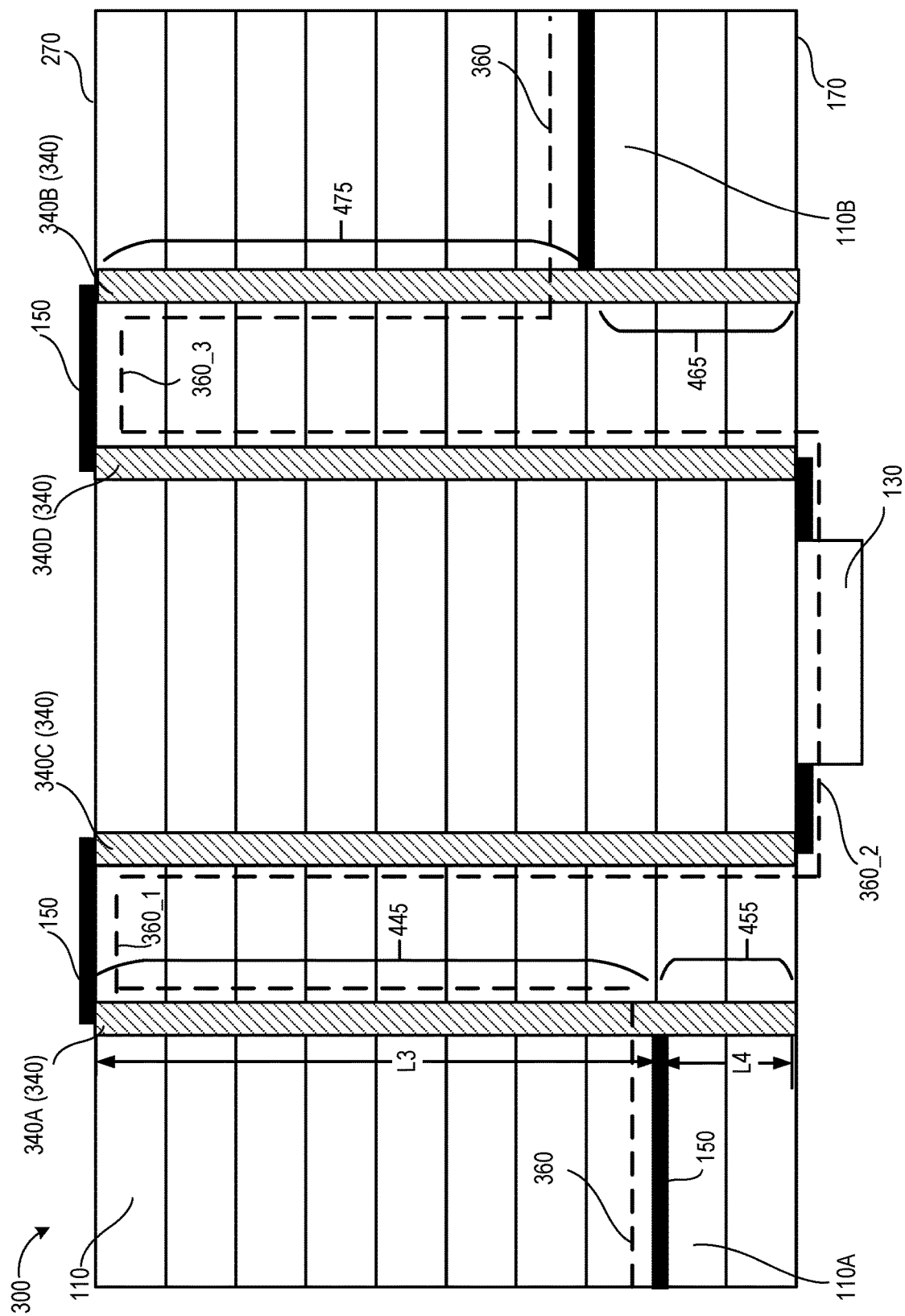
FIG. 4A is a schematic cross-section of a PCB, in accordance with some embodiments of the present disclosure.

FIG. 4A is a schematic cross-section of a PCB 300, in accordance with some embodiments of the present disclosure. FIG. 4A illustrates a PCB 300 having a conductive path 360 having reduced stubs as compared to the configuration of FIG. 1A. A description of elements of FIG. 4A that have been previously described with respect to previous figures will be omitted for brevity.

Referring to FIG. 4A, the PCB 300 may include a plurality of layers 110. In some embodiments, a conductive path 360 may be formed that extends from a first layer 110A to a second layer 110B by way of an electronic component 130 mounted on a first surface 170 of the PCB 300. Portions of the conductive path 360 may include one or more vias 340 so as to transition between layers 110 and/or between a layer 110 and a surface 170 of the PCB 300.

To avoid a stub having an excessive length as part of a via 340, the routing of the conductive path 360 may be altered to include additional vias 340. For example, the conductive path 360 may include a first via 340A, a second via 340B, a third via 340C, and a fourth via 340D. For example, the conductive path 360 may be routed on the first layer 110A (e.g., by way of a conductive trace/wire 150 on the first layer 110A) to a first via 340A and then routed on and/or through the first via 340A to a second surface 270 of the PCB 300. The second surface 270 of the PCB 300 may be a surface of the PCB 300 that is opposite from the first surface 170 upon which the electronic component 130 is mounted.

The conductive path 360 may include a first segment 360_1 (e.g., as part of a conductive trace/wire 150) that extends on the surface 270 of the PCB 300 to a third via 340C. The conductive path 360 may extend the length of the third via 340C to the opposite surface 170 of the PCB 300. A second segment 360_2 of the conductive path 360 may extend on the surface 170 of the PCB 300, and may couple to the electronic component 130. For example, the conductive path 360 may include mounting pads on the first surface 170 to which the electronic component 130 is mounted. The second segment 360_2 of the conductive path 360 may extend on the surface 170 to connect to a fourth via 340D.

The conductive path 360 may extend the length of the fourth via 340D to the second surface 270 of the PCB 300. On the surface 270, a third segment 360_3 of the conductive path 360 may couple to the second via 340B. The conductive path 360 may extend on the second via 340B to the second layer 110B. Thus, the conductive path 360 may extend multiple times between the opposing surfaces 170, 270 of the PCB 300.

Utilizing additional vias 340 to extend the conductive path to extend on both surfaces 170, 270 of the PCB results in a similar configuration of the conductive path 360 with respect to the first via 340A and second via 340B as illustrated and described herein with respect to FIGS. 3A and 3B. For example, the first via 340A may have a first portion 445 that is part of the conductive path 360 (e.g., on the conductive path 360 between the first layer 110A and the second layer 110B) and a second portion 455 that is not on the conductive path 360 between the first layer 110A and the second layer, but is electrically coupled to the first portion 445. In some embodiments, a length L3 (e.g., a longitudinal dimension) of the first portion 445 of the first via 340A may be greater than a length L4 of the second portion 455 of the first via 340A. Stated, another way, the length L3 of the first portion 445 of the first via 340A between the first layer 110A and the surface 270 to which the conductive path 360 extends may be greater than a distance between the first layer 110A and the first surface 170 upon which the electronic component 130 is mounted. In some embodiments, the length L4 of the second portion 455 is smaller than 0.5 mm.

Also, as illustrated in FIG. 4A, the second via 340B may have a first portion 475 that is part of the conductive path 360 (e.g., on the conductive path 360 between the first layer 110A and the second layer 110B) and a second portion 465 that is not on the conductive path 360 between the first layer 110A and the second layer, but is electrically coupled to the first portion 475. In some embodiments, a length (e.g., a longitudinal dimension) of the first portion 475 of the second via 340B may be greater than a length of the second portion 465 of the second via 340B. In some embodiments, the length of the second portion 465 of the second via 340B is smaller than 0.5 mm.

The use of the first via 340A as part of the conductive path 360 results in a stub formed from the second portion 455 of the first via 340A. Similarly, the use of the second via 340B as part of the conductive path 360 may result in a stub formed from the second portion 465 of the second via 340B that is not part of the conductive path 360. However, the stubs 355, 365 (e.g., the second portion 355 of the first via 340A and the second portion 365 of the second via 340B) are smaller in size than if the conductive path 360 had been run directly to the surface 170 upon which the electronic component 130 is mounted as in the PCB 100 of FIG. 1A. The reduced length of the stubs 355, 365 may make them less susceptible to resonance and signal interference at the operating frequencies of the PCB 300. For example, a length of the stubs 355, 365 are more likely to meet the characteristics of Equation 1.

It may be noted that the conductive path 360 also includes the full lengths of the third via 340C and the fourth via 340D. Because the full lengths of the vias 340C, 340D are utilized, no, or very marginal, stubs are created with respect to the connections to these vias 340C, 340D.

Figure 4B:
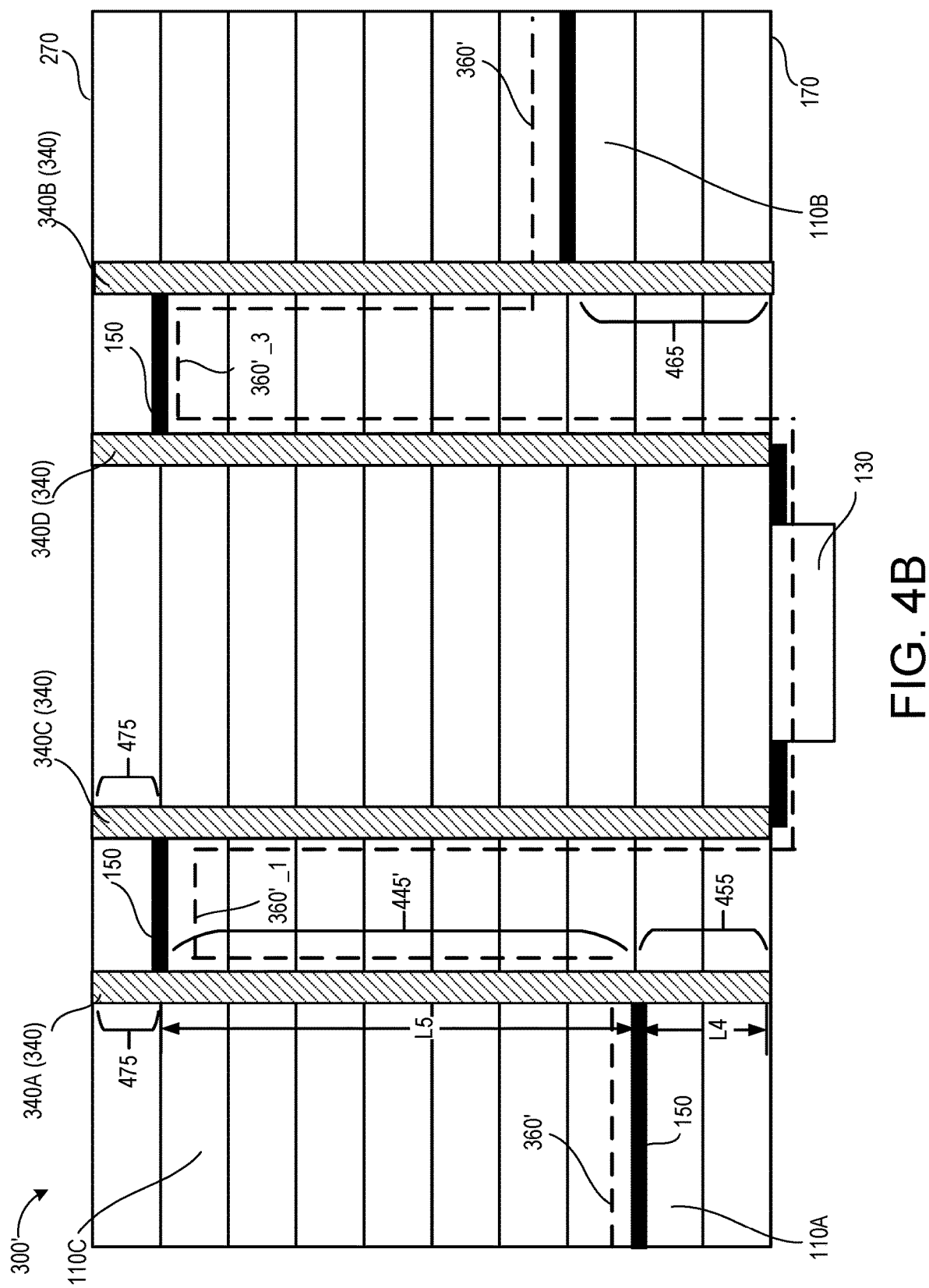
FIG. 4B is a schematic cross-section of a PCB utilizing an alternate conductive path, in accordance with some embodiments of the present disclosure.

Though FIG. 4A illustrates the conductive path 360 extending all the way to the second surface 270 of the PCB 300 that is opposite the first surface 170 upon which the electronic component 130 is mounted, the embodiments of the present disclosure are not limited to this configuration. FIG. 4B is a schematic cross-section of a PCB 300' utilizing an alternate conductive path 360', in accordance with some embodiments of the present disclosure.

Referring to FIG. 4B, the conductive path 360' may extend to a higher layer 110C (e.g., within a threshold number of layers 110 from the second surface 270) that is closer to the second surface 270 than the first layer 110A, and a first portion 360'_1 of the conductive path 360' may extend along the higher layer 110C below the second surface 270. Similarly, a third portion 360'_3 of the conductive path 360' may extend along the higher layer 110C below the second surface 270. By not extending all the way to the second surface 270, a size (e.g., a length L5) of the first portion 445' of the first via 340A that is part of the conductive path 360' may be smaller than the configuration illustrated in FIG. 4A. As illustrated in FIG. 4B, this may result in a configuration that has a generated stub 475 on the first via 340A and the third via 340C (as well as on the second via 340B and the fourth via 340D). However, the stub 475 may be relatively small (e.g., the size of just a few layers) such that the stub 475 satisfies the limits of Equation 1.

The embodiment of FIG. 4B may allow the construction of a conductive path 360' that reduces the size of a stub 455 without traversing on the second surface 270. Such a configuration may be useful if the second surface 270 is densely populated or otherwise difficult to form a conductive trace 150 upon.

The example embodiments have illustrated configurations of PCBs 200, 300, 300' that may reduce a size of a stub 355, 455 when creating a conductive path 260, 360, 360' to an electronic component 130 on a surface 170, 270 of the PCB 200, 300, 300'. However, the embodiments of the present disclosure are not limited to such a configuration. In some embodiments, techniques as described herein may be useful in reducing a stub length in a transition of a conductive path between layers.

Figure 5:
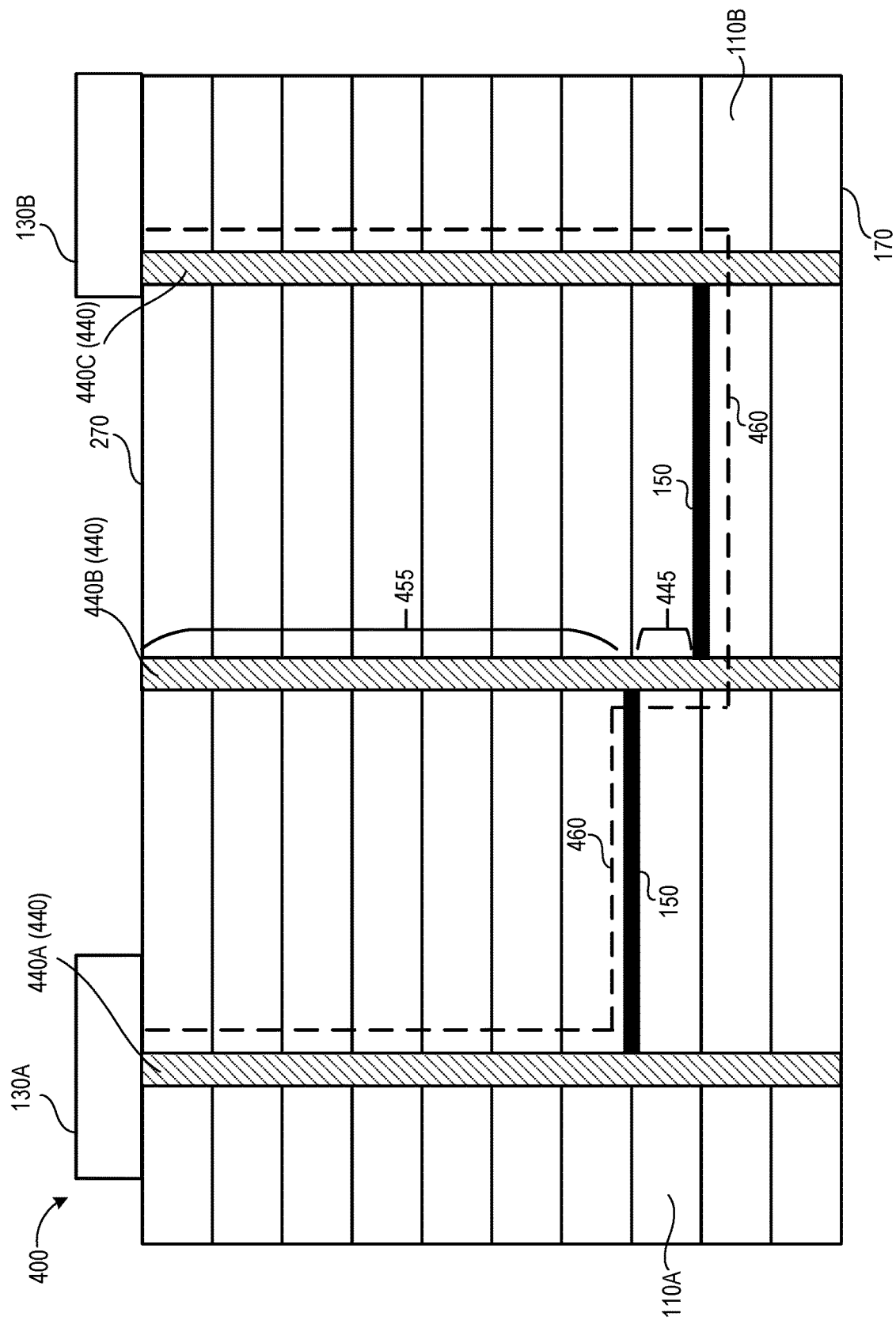
FIG. 5 is a schematic block diagram of a PCB illustrating a transition of a conductive path.

FIG. 5 is a schematic block diagram of a PCB 400 illustrating a transition of a conductive path 460 in the PCB 400. FIG. 5 illustrates the formation of a stub 455 due to a transition between layers 110 of the PCB 400. An explanation of elements of FIG. 5 that have been described previously will be omitted for brevity.

Referring to FIG. 5, a conductive path 460 may be formed within PCB 400. In the example of FIG. 5, the conductive path 460 is routed from a first electronic component 130A to a second electronic component 130B within the PCB 400.

The conductive path 460 may be routed utilizing one or more vias 440. In the example of FIG. 5, the conductive path 460 makes at least one transition from a first layer 110A to a second layer 110B that is at a different level in the PCB 400.

For example, the conductive path 460 may extend from the first electronic component 130A along a first via 440A through one or more layers 110 of the PCB 400. The conductive path 460 may extend along the first via 440A to the first layer 110A. The conductive path 460 may then extend along the first layer 110A (e.g., along a conductive wire/trace 150 of the first layer 110A) to a second via 440B. The conductive path 460 may then transition from the first layer 110A to the second layer 110B by way of the second via 440B. From the second via 440B, the conductive path 460 may transition along the second layer 110B (e.g., along a conductive wire/trace 150 of the second layer 110B) to a third via 440C. The conductive path 460 may extend to the second electronic component 130B by way of the third via 440C through one or more layers 110 of the PCB 400.

As illustrated in FIG. 5, a first portion 445 of the conductive path 460 along the second via 440B is a relatively small portion of the second via 440B. In other words, a second portion 455 of the second via 440B that is not part of the conductive path 460 but is electrically connected to the conductive path 460 may form a stub 455. As previously described, the stub 455 within the second via 440B may be susceptible to resonance and may negatively impact the performance of the PCB 400 in a way similar to that described herein (e.g., with respect to FIG. 1).

Figure 6A:
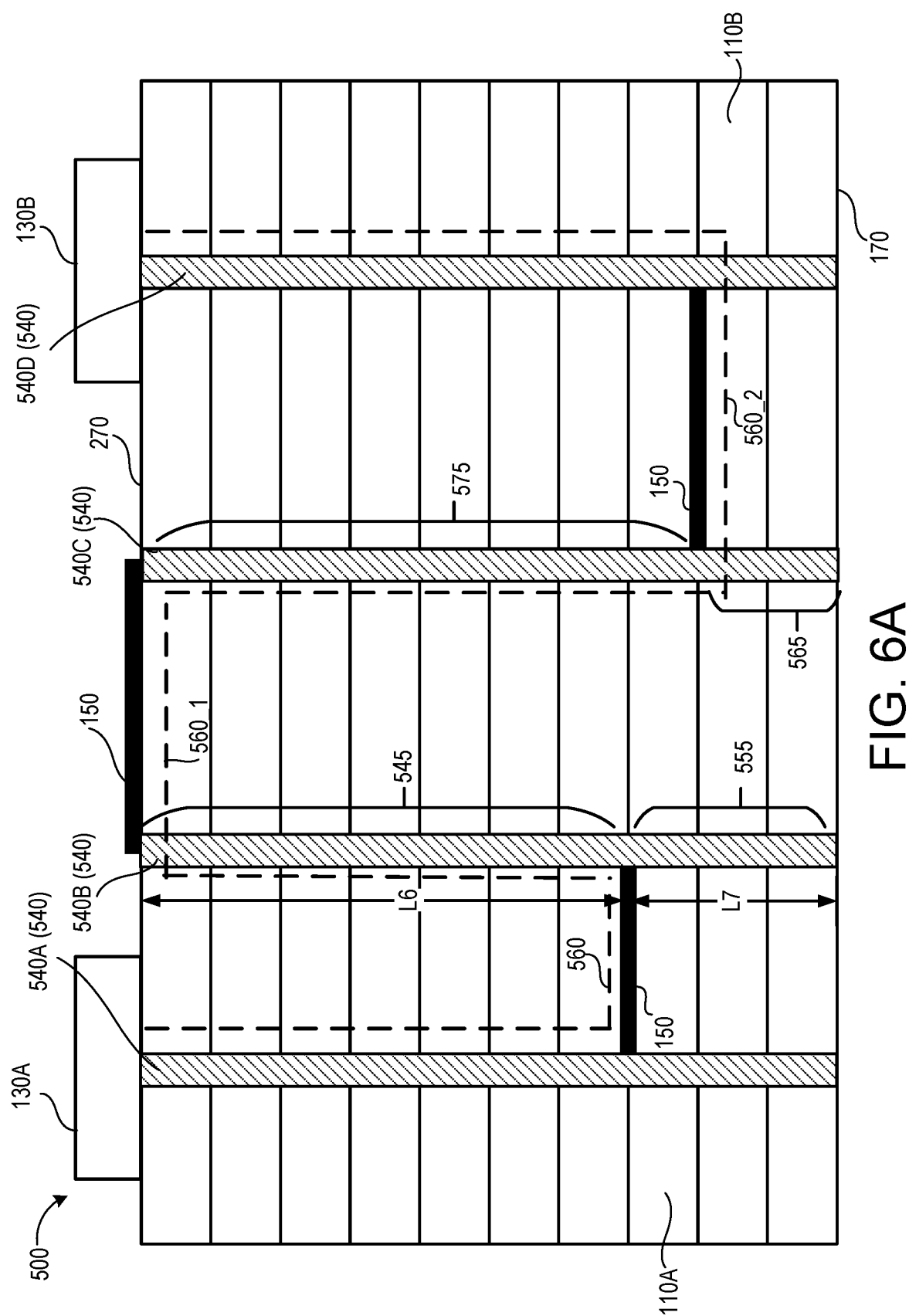
FIG. 6A is a schematic cross-section of a PCB, in accordance with some embodiments of the present disclosure.

FIG. 6A is a schematic cross-section of a PCB 500, in accordance with some embodiments of the present disclosure. FIG. 6A illustrates a PCB 500 having a conductive path 560 having reduced stubs as compared to the configuration of FIG. 5. A description of elements of FIG. 6A that have been previously described with respect to previous figures will be omitted for brevity.

Referring to FIG. 6A, the PCB 500 may include a plurality of layers 110. In some embodiments, a conductive path 560 may be formed that extends from a first electronic component 130A to a second electronic component 130B by way of a first layer 110A and a second layer 110B. The second layer 110B may be a different layer 110 from the first layer 110A (e.g., may be at a different level in the stack of layers 110), and the conductive path 560 may transition from the first layer 110A to the second layer 110B within the PCB 500. Portions of the conductive path 560 may include one or more vias 540 so as to transition between layers 110 and/or between a layer 110 and a first surface 170 and/or a second surface 270 of the PCB 500.

To avoid a stub having an excessive length as part of a via 540, the routing of the conductive path 560 may be designed and/or altered to include additional vias 540 (e.g., as compared to the example of FIG. 5). For example, the conductive path 560 may include a first via 540A, a second via 540B, a third via 540C, and a fourth via 540D. For example, the conductive path 560 may be routed from the first electronic component 130A to the first layer 110A using the first via 540A through one or more layers 110 of the PCB 500. The conductive path 560 may then extend on the first layer 110A (e.g., by way of a conductive trace/wire 150 on the first layer 110A) to a second via 540B and then routed on and/or through the second via 540B through one or more layers 110 of the PCB 500 to a second surface 270 of the PCB 500. In some embodiments, the second surface 270 of the PCB 500 may be a surface of the PCB 500 that is farthest, of the first and second opposing surfaces 170, 270 of the PCB 500, from the first layer 110A.

The conductive path 560 may include a first segment 560_1 (e.g., as part of a conductive trace/wire 150) that extends on the surface 270 of the PCB 500 to a third via 540C. The conductive path 360 may extend along the third via 540C through one or more layers 110 of the PCB 400 to the second layer 110B of the PCB 500. A second segment 560_2 of the conductive path 560 may extend on the second layer 110B to connect to a fourth via 540D. The conductive path 560 may extend along the fourth via 540D through one or more layers 110 of the PCB 400 to the second surface 270 of the PCB 500 to couple to the second electronic component 130B.

Utilizing additional vias 540 to enlarge the conductive path 560 to extend to the second surface 270 of the PCB 500 results in a configuration in which a size of a potential stub 555 of the second via 540B is reduced as compared to the PCB 400 of FIG. 5. For example, the second via 540B may have a first portion 545 that is part of the conductive path 560 (e.g., on the conductive path 560 between the first layer 110A and the second layer 110B) and a second portion 555 that is not on the conductive path 560 between the first layer 110A and the second layer, but is electrically coupled to the first portion 545. In some embodiments, a length L6 (e.g., a longitudinal dimension) of the first portion 545 of the second via 540B may be greater than a length L7 of the second portion 555 of the second via 540B. In some embodiments, the length L7 of the second portion 555 is smaller than 0.5 mm. Stated, another way, the length L6 of the first portion 545 of the second via 540B between the first layer 110A and the second surface 270 to which the conductive path 560 extends may be greater than a distance between the first layer 110A and the first surface 170 opposite the second surface 270. The conductive path 560 may be routed on the second via 540B so as to increase an amount of the second via 540B that is used as part of the conductive path 560, and therefore reduce the size of a potential stub 555.

Also, as illustrated in FIG. 6A, the third via 540C may have a first portion 575 that is part of the conductive path 560 (e.g., on the conductive path 560 between the first layer 110A and the second layer 110B) and a second portion 565 that is not on the conductive path 560 between the first layer 110A and the second layer, but is electrically coupled to the first portion 575. In some embodiments, a length (e.g., a longitudinal dimension) of the first portion 575 of the third via 540C may be greater than a length of the second portion 565 of the third via 540C. In some embodiments, the length of the second portion 565 of the third via 540C is smaller than 0.5 mm.

The use of the second via 540B and third via 540C as part of the conductive path 560 results in a stub formed from the second portion 555 of the second via 540B. However, the stub 555 (e.g., the second portion 555 of the second via 540B) is smaller in size than a stub formed if the conductive path 560 had been run directly between the first layer 110A and the second layer 110B along the second via 540B (as in the example of FIG. 5). The reduced length of the stub 555 may make it less susceptible to resonance and signal interference at the operating frequencies of the PCB 500. For example, the stub 555 is more likely to meet the characteristics of Equation 1.

In will be understood that, though FIG. 6A illustrates a transition from a first layer 110A to a second layer 110B that utilizes a conductive path 560 that is coupled between two electronic components 130A, 130B, it will be understood that this is only an example. In some embodiments, the transition between layers 110A, 110B may be provided in other types of conductive paths 560. Thus, the embodiments of the present disclosure are not limited to the physical configuration illustrated in FIG. 6A.

Figure 6B:
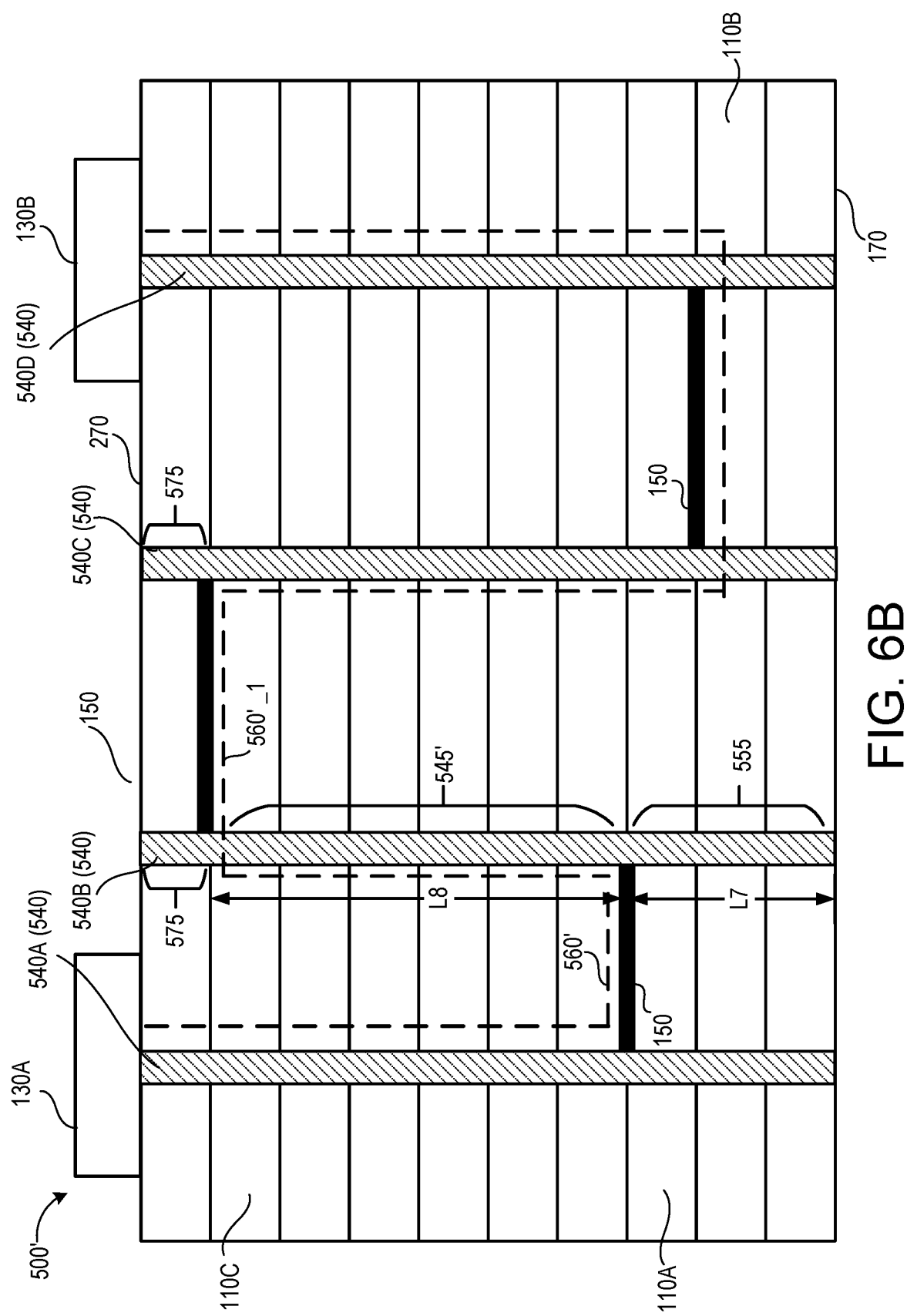
FIG. 6B is a schematic cross-section of a PCB utilizing an alternate conductive path, in accordance with some embodiments of the present disclosure.

Though FIG. 6A illustrates the conductive path 560 extending all the way to the second surface 270 of the PCB 500, the embodiments of the present disclosure are not limited to this configuration. FIG. 6B is a schematic cross-section of a PCB 500' utilizing an alternate conductive path 560', in accordance with some embodiments of the present disclosure.

Referring to FIG. 6B, the conductive path 560' may extend to a higher layer 110C (e.g., within a threshold number of layers 110 from the second surface 270) that is closer to the second surface 270 than the first layer 110A, and a first portion 560'_1 of the conductive path 560' may extend along the higher layer 110C below the second surface 270. By not extending all the way to the second surface 270, a size (e.g., a length L8) of the first portion 545' of the second via 540B that is part of the conductive path 560' may be smaller than the configuration illustrated in FIG. 6A. As illustrated in FIG. 6B, this may result in a configuration that has a generated stub 575 on the second via 540B and the third via 540C. However, the stub 575 may be relatively small (e.g., the size of just a few layers) such that the stub 575 satisfies the limits of Equation 1.

The embodiment of FIG. 6B may allow the construction of a conductive path 560' that reduces the size of a stub 555 without traversing on the second surface 270. Such a configuration may be useful if the second surface 270 is densely populated or otherwise difficult to form a conductive trace 150 upon.

The example embodiments have illustrated configurations of PCBs 500, 500' that may reduce a size of a stub 555 when transitioning between layer 110 of the PCB 500, 500'. In some embodiments, techniques as described herein may be useful in reducing a stub length in a transition of a conductive path between layers.

Figure 7A:
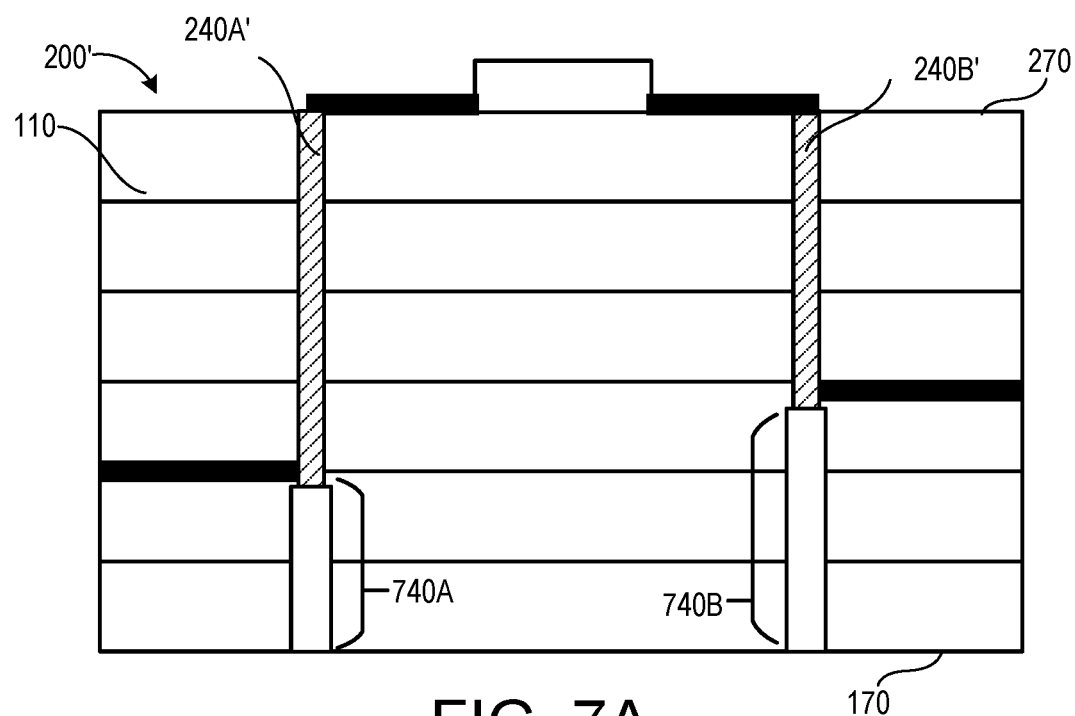
FIG. 7A is a schematic block diagram illustrating an improvement to the PCB of FIG. 3A, in accordance with some embodiments of the present disclosure.
Figure 7B:
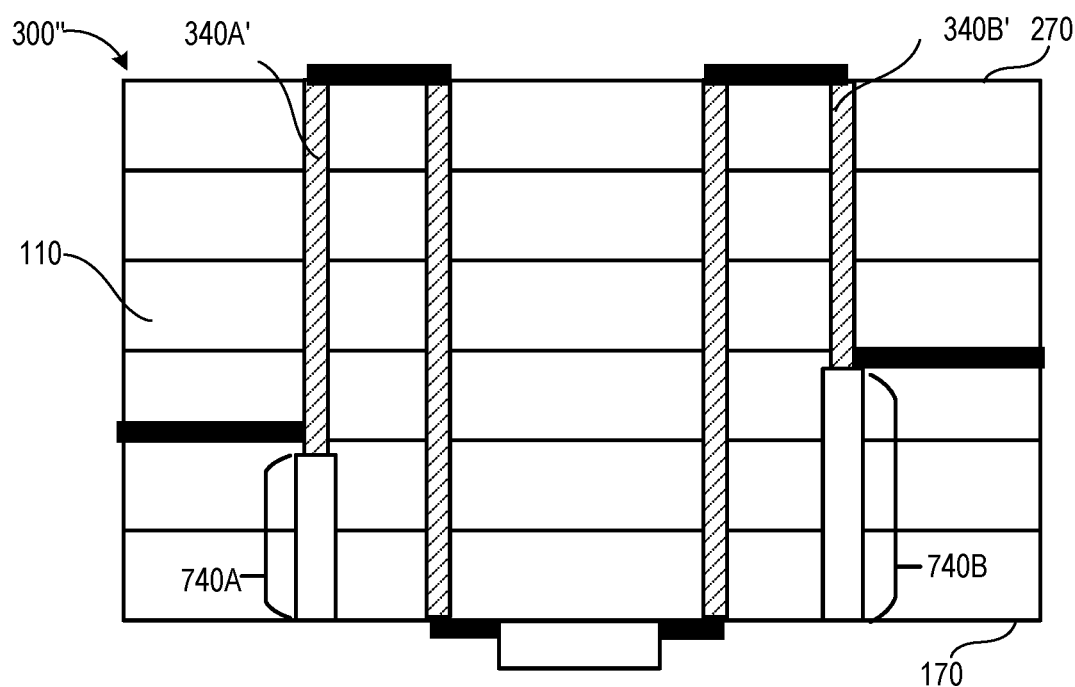
FIG. 7B is a schematic block diagram illustrating an improvement to the PCB of FIG. 4A, in accordance with some embodiments of the present disclosure.
Figure 7C:
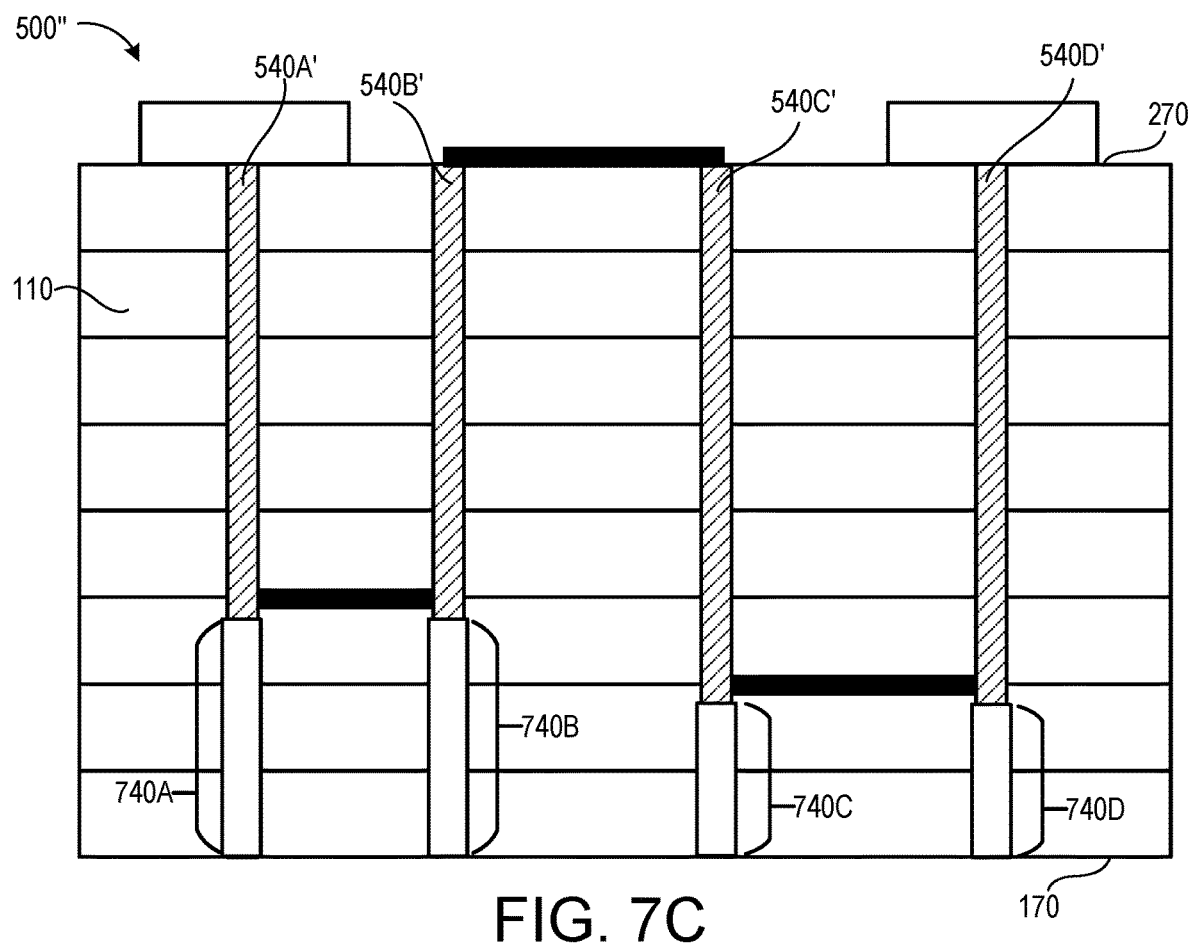
FIG. 7C is a schematic block diagram illustrating an improvement to the PCB of FIG. 6A, in accordance with some embodiments of the present disclosure.

FIGS. 7A to 7C illustrate additional improvements that can be made to PCBs according to some embodiments of the present disclosure. FIG. 7A is a schematic block diagram illustrating an improvement to the PCB 200 of FIG. 3A. FIG. 7B is a schematic block diagram illustrating an improvement to the PCB 300 of FIG. 4A. FIG. 7C is a schematic block diagram illustrating an improvement to the PCB 500 of FIG. 6A.

As described herein, in some configurations a via may form a stub that may be susceptible to resonance and contribute to degradation of the resulting PCB. As also described herein, embodiments of the present disclosure may be capable of reducing a size of the resulting stubs to reduce and/or eliminate this degradation.

In some embodiments, it may be possible to further remove and/or reduce the resulting stubs by removing portions of the via contributing to the stub. FIG. 7A illustrates a PCB 200' having a configuration similar to that of FIG. 3A. A description of elements of FIG. 7A that have been previously described will be omitted for brevity. In FIG. 7A, the number of layers 110 have been reduced for clarity.

In the PCB 200' of FIG. 7A, the portion of the first via 240A' that would otherwise create a potential stub (e.g., as in the second portion 355 of FIG. 3A) has been removed, resulting in a first non-conductive portion 740A. Similarly, a second non-conductive portion 740B may be formed in second via 240B'. In some embodiments, the first non-conductive portion 740A and the second non-conductive portion 740B may be formed by back drilling. Back drilling, also known as controlled depth drilling (CDD), is a technique used to remove an unused portion of a conductive via 240. In back drilling a portion of the PCB 200' slightly larger in diameter than the first via 240A' may be removed from the first via 240A', such as by a drill bit or other excavating element. In this way, the stub (e.g., the second portion 355 of FIG. 3A) may be removed. A similar back drilling process may be performed for the second via 240B'.

In some embodiments, back drilling may be easier to perform from one surface (e.g., the first surface 170) that another surface (e.g., the second surface 270). For example, referring back to FIG. 1A, the configuration of the PCB 100 may result in a stub 155 that may only be reached (e.g., to back drill) from the second surface (e.g., opposite the first surface 170). Techniques described herein may not only allow for a given stub for a via to be reduced in size, but they may be used to move the stub to a portion of the via that may be easier to back drill (e.g., from the first surface 170).

Referring to FIG. 7B, the PCB 300 of FIG. 4A may be further improved by back drilling to create PCB 300". For example, the portions of the first via 340A' and the second via 340B' that would otherwise form a stub may be removed (e.g., by back drilling) to form first and second non-conductive portions 740A, 740B. The first and second non-conductive portions 740A, 740B may be formed through access from the first surface 170 of the PCB 300", which may be a surface of the PCB 300" that is less densely populated and/or easier to back drill.

Referring to FIG. 7C, the PCB 500 of FIG. 6A may be further improved by back drilling to create PCB 500". For example, the portions of the first via 540A', the second via 540B', the third via 540C', and the fourth via 540D' that would otherwise form a stub may be removed (e.g., by back drilling) to form first through fourth non-conductive portions 740A, 740B, 740C, 740D. The first through fourth non-conductive portions 740A, 740B, 740C, 740D may be formed through access from the first surface 170 of the PCB 500", which may be a surface of the PCB 500" that is less densely populated and/or easier to back drill.

Figure 8:
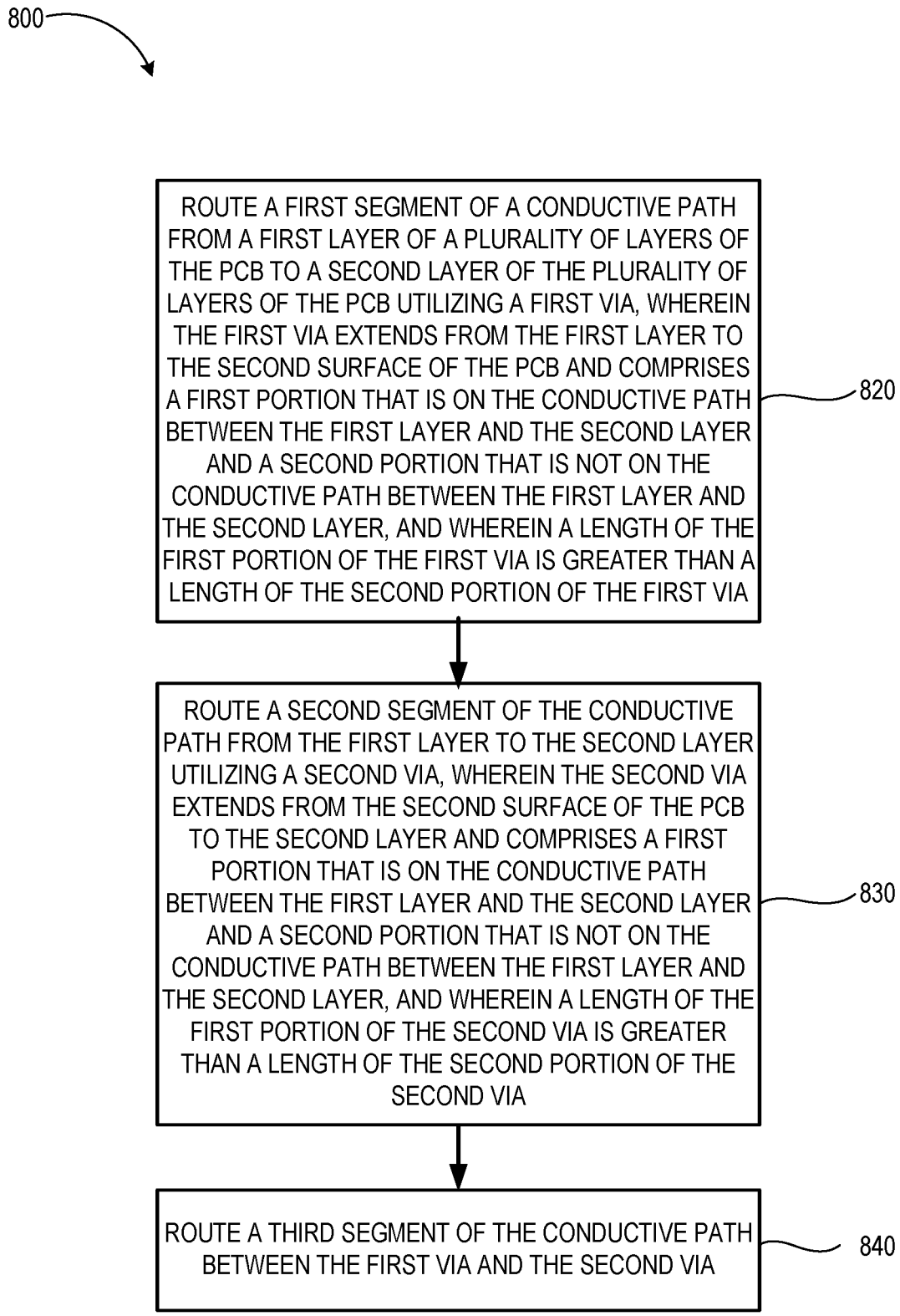
FIG. 8. is a flow diagram of a method for routing a conductive path in a PCB, in accordance with some embodiments of the present disclosure.

FIG. 8 is a flow diagram of a method 800 for routing a conductive path in a PCB, in accordance with some embodiments of the present disclosure. Method 800 may be performed by processing logic that may comprise hardware (e.g., circuitry, dedicated logic, programmable logic, a processor, a processing device, a central processing unit (CPU), a system-on-chip (SoC), etc.), software (e.g., instructions running/executing on a processing device), firmware (e.g., microcode), or a combination thereof. In some embodiments, the method 800 may be performed by a computing device.

With reference to FIG. 8, method 800 illustrates example functions used by various embodiments. Although specific function blocks ("blocks") are disclosed in method 8400, such blocks are examples. That is, embodiments are well suited to performing various other blocks or variations of the blocks recited in method 800. It is appreciated that the blocks in method 800 may be performed in an order different than presented, and that not all of the blocks in method 800 may be performed.

Referring simultaneously to the prior figures as well, the method 800 begins at block 820, where a first segment of a conductive path from a first layer of a plurality of layers of the PCB to a second layer of the plurality of layers of the PCB may be routed utilizing a first via. The first via may extend from the first layer to the second surface of the PCB and may include a first portion that is on the conductive path between the first layer and the second layer and a second portion that is not on the conductive path between the first layer and the second layer. A length of the first portion of the first via may be greater than a length of the second portion. In some embodiments, the first via may be similar to first via 240A, 340A, 340A', 540A, 540A' having first portion 345, 445, 445', 545, 545' and second portion 355, 455, 555, 555' as described herein with respect to FIGS. 3A, 3B, 4A, 4B, 6A, 6B, 7A, 7B, and 7C. In some embodiments, the first layer may be a different layer from the second layer. In some embodiments, the length of the second portion of the first via is less than 0.5 mm.

At block 830, a second segment of the conductive path from the first layer to the second layer may be routed utilizing a second via. The second via may extend from the second surface of the PCB to the second layer and may include a first portion that is on the conductive path between the first layer and the second layer and a second portion that is not on the conductive path between the first layer and the second layer. A length of the first portion of the second via may be greater than a length of the second portion of the second via. In some embodiments, the second via may be similar to vias 240B, 340B, 340B', 540C, 540C', as described herein with respect to FIGS. 3A, 3B, 4A, 4B, 6A, 6B, 7A, 7B, and 7C.

At block 840, a third segment of the conductive path may be routed between the first via and the second via. In some embodiments, the third segment of the conductive path is on the second surface of the PCB.

In some embodiments, the method 800 further includes routing a fourth segment of the conductive path that is electrically between the first via and the second via from the first surface to the second surface utilizing a third via, and routing a fifth segment of the conductive path that is electrically between the first via and the second via from the first surface to the second surface utilizing a fourth via. In some embodiments, the third via may be similar to via 340C and the fourth via may be similar to via 340D as described herein with respect to FIGS. 4A and 4B. In some embodiments, the method 800 further includes disposing a circuit component, such as electronic component 130 as described herein, on the first surface and electrically coupled between the third via and the fourth via.

In some embodiments, the method 800 further includes removing a second portion of the first via between the second surface and the first layer as described herein with respect to FIGS. 7A, 7B, and 7C.

Figure 9:
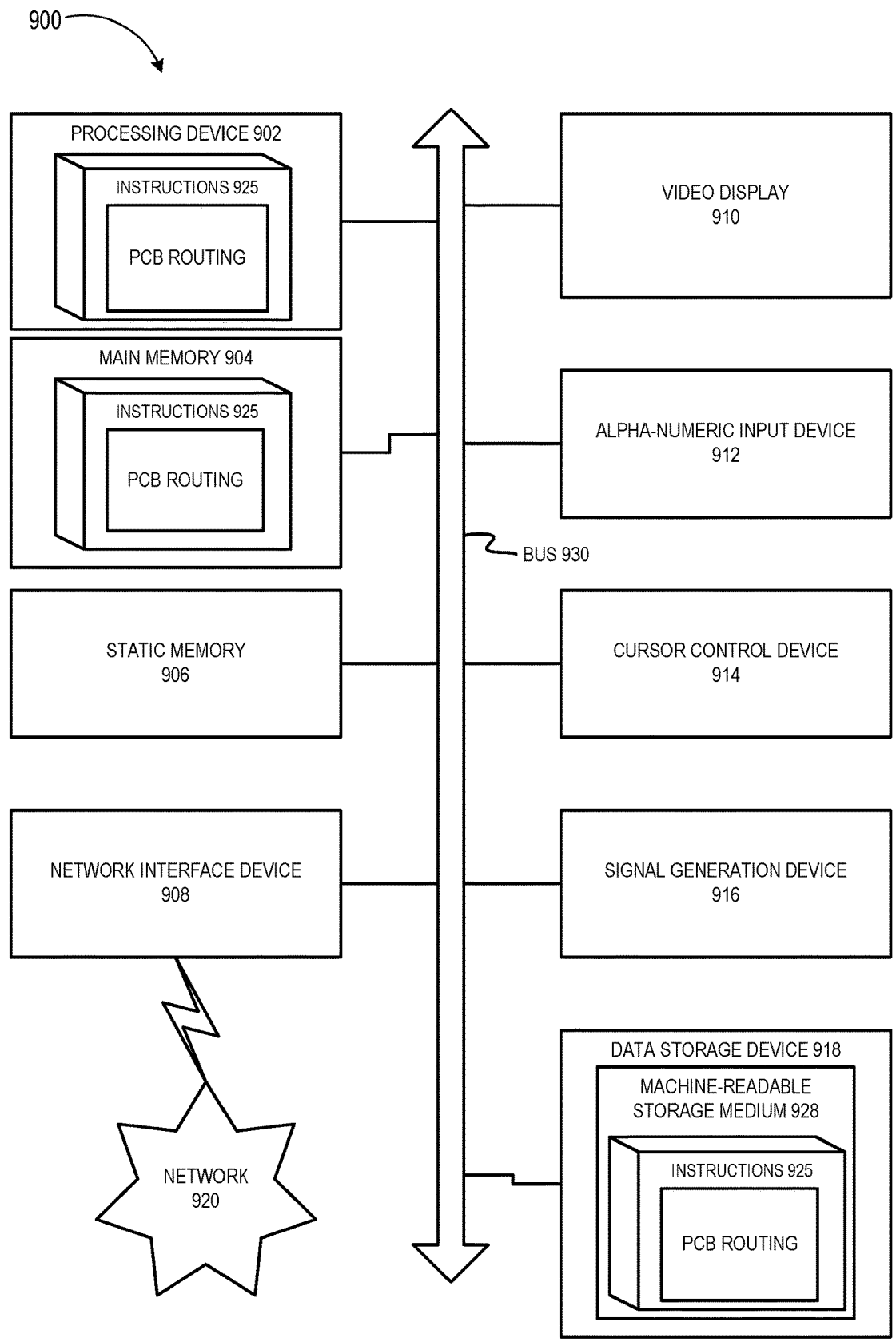
FIG. 9 is a block diagram of an example computing device that may perform one or more of the operations described herein, in accordance with some embodiments of the disclosure.

FIG. 9 is a block diagram of an example computing device 900 that may perform one or more of the operations described herein, in accordance with some embodiments of the disclosure. Computing device 900 may be connected to other computing devices in a LAN, an intranet, an extranet, and/or the Internet. The computing device may operate in the capacity of a server machine in client-server network environment or in the capacity of a client in a peer-to-peer network environment. The computing device may be provided by a personal computer (PC), a set-top box (STB), a server, a network router, switch or bridge, or any machine capable of executing a set of instructions (sequential or otherwise) that specify actions to be taken by that machine. Further, while only a single computing device is illustrated, the term "computing device" shall also be taken to include any collection of computing devices that individually or jointly execute a set (or multiple sets) of instructions to perform the methods discussed herein.

The example computing device 900 may include a processing device (e.g., a general purpose processor, a PLD, etc.) 902, a main memory 904 (e.g., synchronous dynamic random access memory (DRAM), read-only memory (ROM)), a static memory 906 (e.g., flash memory and a data storage device 918), which may communicate with each other via a bus 930.

Processing device 902 may be provided by one or more general-purpose processing devices such as a microprocessor, central processing unit, or the like. In an illustrative example, processing device 902 may include a complex instruction set computing (CISC) microprocessor, reduced instruction set computing (RISC) microprocessor, very long instruction word (VLIW) microprocessor, or a processor implementing other instruction sets or processors implementing a combination of instruction sets. Processing device 902 may also include one or more special-purpose processing devices such as an application specific integrated circuit (ASIC), a field programmable gate array (FPGA), a digital signal processor (DSP), network processor, or the like. The processing device 902 may execute the operations described herein, in accordance with one or more aspects of the present disclosure, for performing the operations and steps discussed herein.

Computing device 900 may further include a network interface device 908 which may communicate with a network 920. The computing device 900 also may include a video display unit 910 (e.g., a liquid crystal display (LCD) or a cathode ray tube (CRT)), an alphanumeric input device 912 (e.g., a keyboard), a cursor control device 914 (e.g., a mouse) and an acoustic signal generation device 916 (e.g., a speaker). In one embodiment, video display unit 910, alphanumeric input device 912, and cursor control device 914 may be combined into a single component or device (e.g., an LCD touch screen).

Data storage device 918 may include a computer-readable storage medium 928 on which may be stored one or more sets of instructions 925 that may include instructions for a component (e.g., PCB routing, including, but not limited to, operations discussed herein with respect to FIG. 8) for carrying out the operations described herein, in accordance with one or more aspects of the present disclosure. Instructions 925 may also reside, completely or at least partially, within main memory 904 and/or within processing device 902 during execution thereof by computing device 900, main memory 904 and processing device 902 also constituting computer-readable media. The instructions 925 may further be transmitted or received over a network 920 via network interface device 908.

While computer-readable storage medium 928 is shown in an illustrative example to be a single medium, the term "computer-readable storage medium" should be taken to include a single medium or multiple media (e.g., a centralized or distributed database and/or associated caches and servers) that store the one or more sets of instructions. The term "computer-readable storage medium" shall also be taken to include any medium that is capable of storing, encoding or carrying a set of instructions for execution by the machine and that cause the machine to perform the methods described herein. The term "computer-readable storage medium" shall accordingly be taken to include, but not be limited to, solid-state memories, optical media and magnetic media.

Unless specifically stated otherwise, terms such as "providing," "routing," "removing," or the like, refer to actions and processes performed or implemented by computing devices that manipulates and transforms data represented as physical (electronic) quantities within the computing device's registers and memories into other data similarly represented as physical quantities within the computing device memories or registers or other such information storage, transmission or display devices. Also, the terms "first," "second," "third," "fourth," etc., as used herein are meant as labels to distinguish among different elements and may not necessarily have an ordinal meaning according to their numerical designation.

Examples described herein also relate to an apparatus for performing the operations described herein. This apparatus may be specially constructed for the required purposes, or it may comprise a general purpose computing device selectively programmed by a computer program stored in the computing device. Such a computer program may be stored in a computer-readable non-transitory storage medium.

The methods and illustrative examples described herein are not inherently related to any particular computer or other apparatus. Various general purpose systems may be used in accordance with the teachings described herein, or it may prove convenient to construct more specialized apparatus to perform the required method steps. The required structure for a variety of these systems will appear as set forth in the description above.

The above description is intended to be illustrative, and not restrictive. Although the present disclosure has been described with references to specific illustrative examples, it will be recognized that the present disclosure is not limited to the examples described. The scope of the disclosure should be determined with reference to the following claims, along with the full scope of equivalents to which the claims are entitled.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting. As used herein, the term "and/or" includes any and all combination of one or more of the associated listed items.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A printed circuit board (PCB) comprising:
a first surface;
a second surface opposite the first surface;
a plurality of layers between the first surface and the second surface, the plurality of layers comprising a first layer and a second layer;
a first via extending from the first layer to the second surface, wherein the first via comprises a first portion that is on a conductive path between the first layer and the second layer and a second portion that is not on the conductive path between the first layer and the second layer, and wherein a length of the first portion of the first via is greater than a length of the second portion of the first via; and
a second via that is electrically coupled to the first via and extends from the second surface to the second layer, wherein the second via comprises a first portion that is on the conductive path between the first layer and the second layer and a second portion that is not on the conductive path between the first layer and the second layer, and wherein a length of the first portion of the second via is greater than a length of the second portion of the second via.

2. The PCB of claim 1, wherein the first layer is a different layer from the second layer.

3. The PCB of claim 1, further comprising:
a third via extending from the first surface to the second surface, the third via forming a first segment of the conductive path between the first via and the second via; and
a fourth via extending from the first surface to the second surface, the fourth via forming a second segment of the conductive path between the first via and the second via.

4. The PCB of claim 3, further comprising a circuit component on the first surface and electrically coupled between the third via and the fourth via.

5. The PCB of claim 1, wherein the second portion of the first via between the first surface and the first layer comprises a non-conductive segment.

6. The PCB of claim 1, wherein the length of the second portion of the first via is less than 0.5 mm.

7. The PCB of claim 1, wherein the first via is electrically coupled to the second via by a conductive segment on the second surface.

8. A method of routing a conductive path within a printed circuit board (PCB) having a first surface and a second surface that is opposite the first surface, the method comprising:
routing a first segment of a conductive path from a first layer of a plurality of layers of the PCB to a second layer of the plurality of layers of the PCB utilizing a first via, wherein the first via extends from the first layer to the second surface of the PCB and comprises a first portion that is on the conductive path between the first layer and the second layer and a second portion that is not on the conductive path between the first layer and the second layer, and wherein a length of the first portion of the first via is greater than a length of the second portion of the first via;
routing a second segment of the conductive path from the first layer to the second layer utilizing a second via, wherein the second via extends from the second surface of the PCB to the second layer and comprises a first portion that is on the conductive path between the first layer and the second layer and a second portion that is not on the conductive path between the first layer and the second layer, and wherein a length of the first portion of the second via is greater than a length of the second portion of the second via; and
routing a third segment of the conductive path between the first via and the second via.

9. The method of claim 8, wherein the first layer is a different layer from the second layer.

10. The method of claim 8, further comprising:
routing a fourth segment of the conductive path that is electrically between the first via and the second via from the first surface to the second surface utilizing a third via; and
routing a fifth segment of the conductive path that is electrically between the first via and the second via from the first surface to the second surface utilizing a fourth via.

11. The method of claim 10, further comprising disposing a circuit component on the first surface and electrically coupled between the third via and the fourth via.

12. The method of claim 8, further comprising removing the second portion of the first via between the first surface and the first layer.

13. The method of claim 8, wherein the third segment of the conductive path is on the second surface of the PCB.

14. The method of claim 8, wherein the length of the second portion of the first via is less than 0.5 mm.

15. A printed circuit board (PCB) comprising:
a plurality of layers, wherein the plurality of layers are between a first surface of the PCB and a second surface of the PCB that is opposite the first surface; and
a conductive path comprising a first segment, a second segment, and a third segment,
wherein the first segment of the conductive path comprises a first via that extends from a first layer of the plurality of layers to the second surface,
wherein a length of a first portion of the first via between the first layer and the second surface is greater than a distance between the first layer and the first surface,
wherein the second segment of the conductive path comprises a second via from the second surface of the PCB to a second layer of the plurality of layers of the PCB,
wherein a length of a first portion of the second via between the second layer and the second surface is greater than a distance between the second layer and the first surface, and
wherein the third segment of the conductive path is electrically coupled between the first via and the second via.

16. The PCB of claim 15, wherein the first layer is a different layer from the second layer.

17. The PCB of claim 15, wherein a fourth segment of the conductive path comprises a third via that is electrically between the first via and the second via and extends from the first surface to the second surface, and wherein a fifth segment of the conductive path comprises a fourth via that is electrically between the first via and the second via and extends from the first surface to the second surface.

18. The PCB of claim 17, further comprising a circuit component on the first surface and electrically coupled on the conductive path between the third via and the fourth via.

19. The PCB of claim 15, wherein a second portion of the first via between the first surface and the first layer comprises a non-conductive segment.

20. The PCB of claim 15, wherein the third segment of the conductive path is disposed on the second surface of the PCB.

\* \* \* \* \*